United States Patent
Mukherjee

(10) Patent No.: US 8,410,831 B2
(45) Date of Patent: Apr. 2, 2013

(54) LOW-VOLTAGE HIGH-SPEED FREQUENCY DIVIDER WITH REDUCED POWER CONSUMPTION

(75) Inventor: Tonmoy Shankar Mukherjee, Atlanta, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 5 days.

(21) Appl. No.: 13/186,614

(22) Filed: Jul. 20, 2011

(65) Prior Publication Data

US 2013/0021068 A1 Jan. 24, 2013

(51) Int. Cl.
*H03K 21/00* (2006.01)
*H03B 19/06* (2006.01)

(52) U.S. Cl. ............ 327/118; 327/115; 327/117; 377/47

(58) Field of Classification Search .......... 327/113–115, 327/117, 118; 377/47, 48
See application file for complete search history.

(56) References Cited

U.S. PATENT DOCUMENTS

| | | | |
|---|---|---|---|
| 6,166,571 A * | 12/2000 | Wang ............................. | 327/115 |
| 6,668,363 B2 | 12/2003 | Minami et al. | |
| 6,831,489 B2 * | 12/2004 | Cheung et al. ................. | 327/115 |
| 7,098,697 B2 | 8/2006 | Kucharski et al. | |
| 7,236,029 B2 * | 6/2007 | Gossmann ..................... | 327/202 |
| 7,298,183 B2 * | 11/2007 | Mirzaei et al. ................. | 327/115 |
| 7,304,519 B2 * | 12/2007 | Neubauer ...................... | 327/203 |
| 7,573,310 B2 | 8/2009 | Yang et al. | |
| 7,626,433 B2 * | 12/2009 | Hoess ............................ | 327/199 |
| 7,663,414 B2 * | 2/2010 | Copani et al. ................. | 327/115 |
| 7,930,673 B2 | 4/2011 | Jiang et al. | |

OTHER PUBLICATIONS

Chen, Lancer et al, "Using Multi-Bit Flip-Flop for Clock Power Saving by DesignCompiler", Synopsys Users Group [online], 2010 [retrieved on Apr. 21, 2011]. Retrieved from the Internet: <URL: http://www.synopsys.com.cn/information/snug/2010/using-multi-bit-flip-flop-for-clock-power-saving-by-designcompiler>.

Heo, Seongmoo et al, "Activity-Sensitive Flip-Flop and Latch Selection for Reduced Energy," 19th Conference on Advanced Research in VLSI (ARVLSI), 2001, 28 unnumbered pages.

* cited by examiner

*Primary Examiner* — Patrick O'Neill
(74) *Attorney, Agent, or Firm* — Eugene C. Conser; Wade J. Brady, III; Frederick J. Telecky, Jr.

(57) ABSTRACT

A low-voltage high-speed frequency divider substantially reduces the power required to generate a half-rate in-phase clock signal and a half-rate quadrature-phase clock signal by reducing the number of pairs of transistors that respond to a full-rate clock signal and a full-rate inverse clock signal.

7 Claims, 4 Drawing Sheets

CLK

OUT-M

OUT-S (I)

OUTZ-M (Q)

LOW-VOLTAGE HIGH-SPEED FREQUENCY DIVIDER WITH REDUCED POWER CONSUMPTION

BACKGROUND OF THE INVENTION

1. Field of the Invention

The present invention relates to low-voltage high-speed frequency dividers and, more particularly, to a low-voltage high-speed frequency divider with reduced power consumption.

2. Description of the Related Art

A frequency divider is an electronic circuit that receives an input clock signal, and generates an output clock signal that has a frequency which is a fraction of the frequency of the input clock signal. One common type of frequency divider is a divide-by-two frequency divider, which divides down the frequency of the input clock signal by two. For example, a divide-by-two frequency divider generates a 12.5 GHz output clock signal in response to a 25 GHz input clock signal.

FIG. 1 shows a schematic diagram that illustrates an example of a conventional divide-by-two frequency divider 100. As shown in FIG. 1, frequency divider 100 includes a master latch 110 and a slave latch 112 that is connected to master latch 110. In the present example, master latch 110 and slave latch 112 are implemented as high-speed current-mode logic (CML) latches.

Master latch 110 and slave latch 112 each has a data input D, a clock input C, and an output Q, along with an inverted data input DZ, an inverted clock input CZ, and an inverted output QZ. The output Q and the inverted output QZ of master latch 110 are connected to the data input D and the inverted data input DZ of slave latch 112, respectively. However, the output Q of slave latch 112 is connected to the inverted data input DZ of master latch 110, and the inverted output QZ of slave latch 112 is connected to the data input D of master latch 110.

In addition, master latch 110 and slave latch 112 each has a pair of input transistors M1 and M2, a pair of clock transistors M3 and M4, and a pair of output transistors M5 and M6. Further, master latch 110 and slave latch 112 each has a resistor R1, a resistor R2, and a bias current source IS. All of the components are connected together in a conventional manner.

FIGS. 2A-2C show timing diagrams that illustrate the operation of frequency divider 100. FIG. 2A shows a full-rate clock signal CLK input to the clock input C, while FIG. 2B shows the output Q of master latch 110 and FIG. 2C shows the output Q of slave latch 112. As shown in FIGS. 2A-2C, both the output Q of master latch 110 and the output Q of slave latch 112 output a signal with a frequency that is one half the frequency of the clock signal CLK.

Although frequency divider 100 can operate at very high speeds, one of the drawbacks of frequency divider 100 is that the minimum supply voltage required by frequency divider 100 is relatively high. This is because the transistors in the master and slave latches 110 and 112 are vertically stacked three levels high.

As a result, the minimum supply voltage required by frequency divider 100 is the sum of the minimum voltage that must lie across the bias current sources IS, the minimum voltage that must lie across the clock transistors M3 and M4, and the minimum voltage that must lie across the input transistors M1 and M2.

One approach to reducing the minimum supply voltage required by a high-speed frequency divider is disclosed in U.S. Pat. No. 7,098,697 to Kucharski et al. The Kucharski frequency divider replaces the latch circuit utilized in master latch 110 and slave latch 112 with a latch circuit that has only two levels and, therefore, a lower minimum supply voltage requirement.

FIG. 3 shows a schematic diagram that illustrates an example of a conventional Kucharski divide-by-two frequency divider 300. As shown in FIG. 3, frequency divider 300 has a master latch 310 and a slave latch 312 that is connected to master latch 310 in the same manner that slave latch 112 is connected to master latch 110.

Master latch 310 and slave latch 312, however, each has a pair of input transistors Q1 and Q2, a first pair of clock transistors Q3 and Q4, a second pair of clock transistors Q6 and Q7, and a pair of storage transistors Q9 and Q10. Each latch 310 and 312 also has a bias current source ISW for the pair of clock transistors Q3 and Q4, a bias current source ISW for the pair of clock transistors Q6 and Q7, a bias current source IB for the pair of input transistors Q1 and Q2, and a bias current source IH for the pair of storage transistors Q9 and Q10.

In addition, each latch 310 and 312 has an output transistor Q5, a resistor R1, a resistor R3, and a diode D1 associated with the first pair of clock transistors Q3 and Q4. Further, each latch 310 and 312 has an output transistor Q8, a resistor R2, a resistor R4, and a diode D2 associated with the second pair of clock transistors Q6 and Q7.

Thus, as shown in FIG. 3, the transistors in the master and slave latches 310 and 312 are vertically stacked only two levels high. (The collectors of transistors Q1, Q2, Q4 and Q6 are connected to the supply voltage VDD by way of the resistors R1 and R2.) As a result, the minimum supply voltage required by frequency divider 300 is approximately the sum of the minimum voltage across the bias current source IB and the minimum voltage across the input transistors Q1 and Q2.

Although frequency divider 300 can operate with a low voltage at very high speeds, one of the drawbacks of frequency divider 300 is that frequency divider 300 consumes a significant amount of power. In addition, the clock signal input to frequency divider 300 must drive four transistors during each clock phase.

Thus, there is a need for a low-voltage high-speed frequency divider that consumes less power and drives less than four transistors during each clock phase.

BRIEF DESCRIPTION OF THE DRAWINGS

FIG. 2A is a full-rate clock signal CLK input to the clock input C, FIG. 2B is the output Q of master latch 110, and FIG. 2C is the output Q of slave latch 112.

FIG. 5A is a full-rate clock signal CLK which is input to the clock input C. FIG. 5B is the output OUT-M of master circuit 410. FIG. 5C is the output OUT-S of slave circuit 412. FIG. 5D is the inverse output OUTZ-M of master circuit 410.

DETAILED DESCRIPTION OF THE INVENTION

Figure 4:
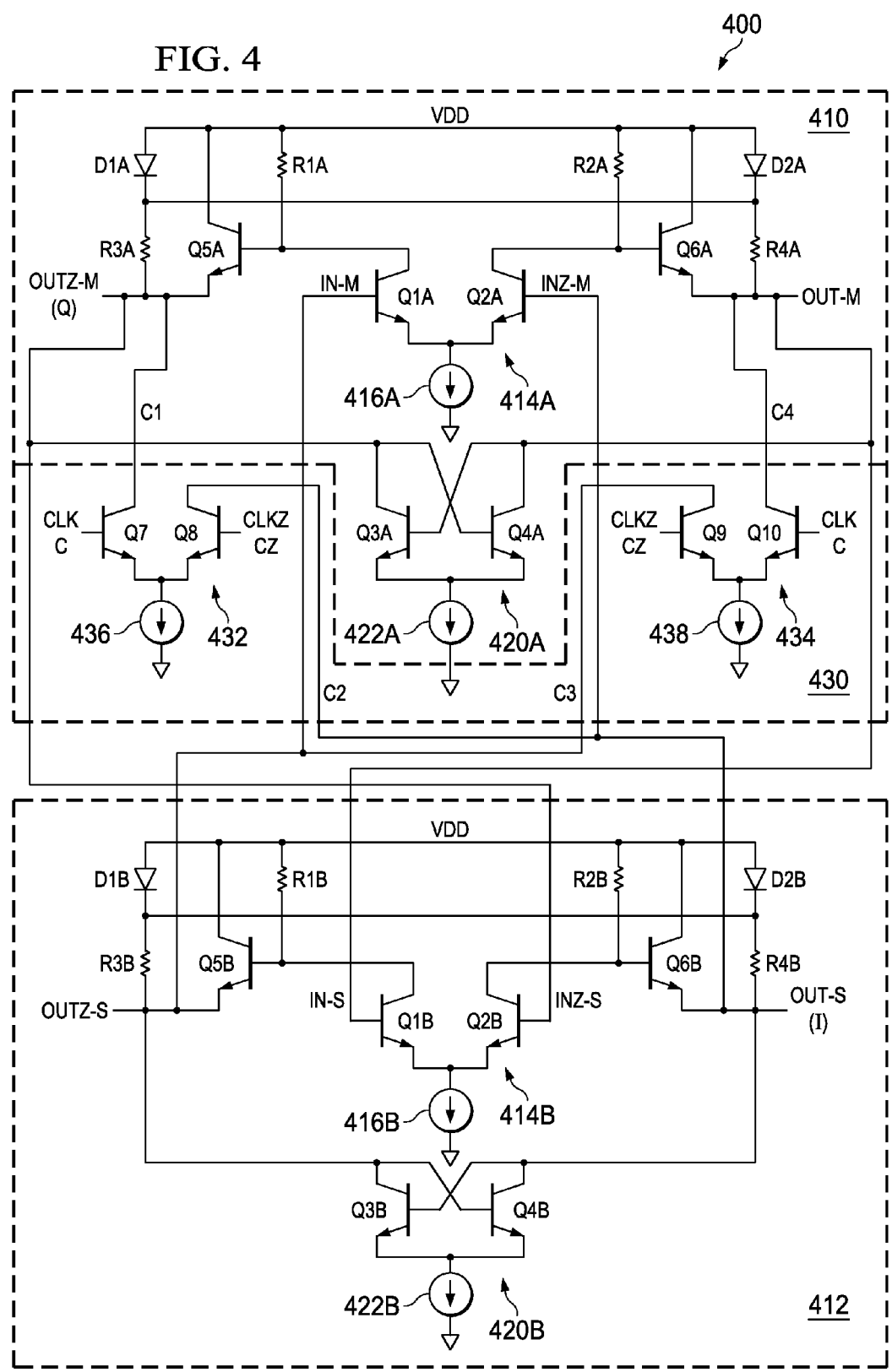
FIG. 4 is a schematic diagram illustrating an example of a divide-by-two frequency divider 400 in accordance with the present invention.

FIG. 4 shows a schematic diagram that illustrates an example of a divide-by-two frequency divider 400 in accordance with the present invention. As described in greater detail below, frequency divider 400 provides low-voltage high-speed operation while substantially reducing the power required to generate a half-rate in-phase clock signal and a half-rate quadrature-phase clock signal by reducing the number of pairs of transistors that respond to a full-rate clock signal and a full-rate inverse clock signal.

As shown in the FIG. 4 example, frequency divider 400 includes a master circuit 410 and a slave circuit 412 that is connected to master circuit 410. Master circuit 410, in turn, has a data input IN-M, an inverted data input INZ-M, an output OUT-M that generates a first half-rate clock signal, and an inverted output OUTZ-M that generates a second half-rate clock signal.

Slave circuit 412, which is identical to master circuit 410, has a data input IN-S, an inverted data input INZ-S, an output OUT-S that generates a third half-rate clock signal, and an inverted output OUTZ-S that generates a fourth half-rate clock signal. The data input IN-S of slave circuit 412 is connected to the output OUT-M of master circuit 410 to receive the first half-rate clock signal, while the inverted data input INZ-S of slave circuit 412 is connected to the inverted output OUTZ-M of master circuit 410 to receive the second half-rate clock signal.

Further, the inverted data input INZ-M of master circuit 410 is connected to the data output OUT-S of slave circuit 412 to receive the third half-rate clock signal, while the data input IN-M of master circuit 410 is connected to the inverted data output OUTZ-S of slave circuit 412 to receive the fourth half-rate clock signal.

As further shown in FIG. 4, master circuit 410 has a pair of input transistors 414A that is connected to the data input IN-M and the inverse data input INZ-M, and a bias current source 416A that is connected to the pair of input transistors 414A. In the present example, the pair of input transistors 414A is implemented with bipolar transistors Q1A and Q2A, which have emitters connected together and to bias current source 416A.

Similarly, slave circuit 412 has a pair of input transistors 414B that is connected to the data input IN-S and the inverse data input INZ-S, and a bias current source 416B that is connected to the pair of input transistors 414B. In the present example, the pair of input transistors 414B is implemented with bipolar transistors Q1B and Q2B, which have emitters connected together and to bias current source 416B.

In addition, master circuit 410 has a resistor R1A that is connected to and between a power supply voltage VDD and transistor Q1A of the pair of input transistors 414A, and a resistor R2A that is connected to and between the power supply voltage VDD and transistor Q2A of the pair of input transistors 414A.

Similarly, slave circuit 412 has a resistor R1B that is connected to and between the power supply voltage VDD and transistor Q1B of the pair of input transistors 414B, and a resistor R2B that is connected to and between the power supply voltage VDD and transistor Q2B of the pair of input transistors 414B. The values of the resistors R1A, R1B, R2A, and R2B are substantially equal.

Further, master circuit 410 has a pair of storage transistors 420A that are connected to the output OUT-M and the inverted output OUTZ-M, and a bias current source 422A that is connected to the pair of storage transistors 420A. In the present example, the pair of storage transistors 420A is implemented with bipolar transistors Q3A and Q4A, which have emitters connected together and to bias current source 422A.

Similarly, slave circuit 412 has a pair of storage transistors 420B that is connected to output OUT-S and the inverse output OUTZ-S, and a bias current source 422B that is connected to the pair of storage transistors 420B. In the present example, the pair of storage transistors 420B is implemented with bipolar transistors Q3B and Q4B, which have emitters connected together and to bias current source 422B.

Master circuit 410 also has an output transistor Q5A that is connected to the supply voltage VDD and transistor Q1A of the pair of input transistors 414A, a diode D1A that is connected to the power supply voltage VDD, and a resistor R3A that is connected to diode D1A, output transistor Q5A, and the inverted output OUTZ-M.

Similarly, slave circuit 412 has an output transistor Q5B that is connected to the supply voltage VDD and transistor Q1B of the pair of input transistors 414B, a diode D1B that is connected to the power supply voltage VDD, and a resistor R3B that is connected to diode D1B, output transistor Q5B, and the inverted output OUTZ-S.

Master circuit 410 further has an output transistor Q6A that is connected to the supply voltage VDD and transistor Q2A of the pair of input transistors 414A, a diode D2A that is connected to the power supply voltage VDD and diode D1A, and a resistor R4A that is connected to diode D2A, output transistor Q6A, and the output OUT-M.

Similarly, slave circuit 412 has an output transistor Q6B that is connected to the supply voltage VDD and transistor Q2B of the pair of input transistors 414B, a diode D2B that is connected to the power supply voltage VDD and diode D1B, and a resistor R4B that is connected to diode D2B, output transistor Q6B, and the output OUT-S.

As additionally shown in FIG. 4, frequency divider 400 also includes a clock circuit 430 that is connected to master circuit 410 and slave circuit 412. Clock circuit 430, in turn, has a clock input C that receives a full-rate clock signal CLK, and an inverted clock input CZ that receives a full-rate inverse clock signal CLKZ.

Further, clock circuit 430 has a first output C1 that is connected to the inverted output OUTZ-M of master circuit 410, and a second output C2 that is connected to the output OUT-S of slave circuit 412. Clock circuit 430 also has a third output C3 that is connected to the inverse output OUTZ-S of the slave circuit 412, and a fourth output C4 that is connected to the output OUT-M of master circuit 410.

Clock circuit 430 additionally includes a first pair of clock transistors 432 and a second pair of clock transistors 434. In the present example, the first pair of clock transistors 432 is implemented with a clock transistor Q7 that connected to output transistor Q5A of master circuit 410, and a clock transistor Q8 that is connected to output transistor Q6B of slave circuit 412. Further, the second pair of clock transistors 434 is implemented with a clock transistor Q9 that is connected to output transistor Q5B of slave circuit 412, and a clock transistor Q10 that is connected to output transistor Q6A of master circuit 410.

In addition, clock circuit 430 has a bias current source 436 that is connected to the first pair of clock transistors 432, and a bias current source 438 that is connected to the second pair of clock transistors 434. Although frequency divider 400 is implemented with bipolar transistors in the present example, MOS transistors can alternately be used, with sources replacing emitters, gates replacing bases, and drains replacing collectors. The differences in the transistors provide different operating characteristics.

In the operation of master circuit 410, when the voltage on the data input IN-M goes high relative to the voltage on the inverse data input INZ-M, substantially all of the current sunk by bias current source 416A flows through resistor R1A and transistor Q1A. Thus, substantially none of the current sunk by bias current source 416A flows through transistor Q2A at this time.

As a result, a first voltage substantially equal to the power supply voltage VDD less the product of the current sunk by bias current source 416A multiplied by the value of resistor R1A is present on the base of transistor Q5A. In addition, since substantially no current flows through transistor Q2A, a second voltage substantially equal to the power supply voltage VDD is present on the base of transistor Q6A. The first voltage, in turn, represents a logic low, while the second voltage represents a logic high.

Alternately, when the voltage on the data input IN-M of master circuit 410 goes low relative to the voltage on the inverse data input INZ-M, substantially all of the current sunk by bias current source 416A flows through resistor R2A and transistor Q2A. Thus, substantially none of the current sunk by bias current source 416A flows through transistor Q1A at this time.

As a result, the first voltage, which represents a logic low, is present on the base of transistor Q6A. In addition, since substantially no current flows through transistor Q1A, the second voltage, which represents a logic high, is present on the base of transistor Q5A. The value of the resistors R1A and R2A and the magnitude of the current sunk by bias current source 416A are selected so that the transistors Q1A and Q2A and the transistors Q5A and Q6A do not saturate. For example, the product of the current sunk by bias current source 416A multiplied by the resistor value can be selected to fall in the range of 200 mV-300 mV.

When the clock signal CLK input to transistors Q7 and Q10 transitions to a logic high, and the inverse clock signal CLKZ input to transistors Q8 and Q9 transitions to a logic low, transistors Q7 and Q10 of clock circuit 430 turn on and transistors Q8 and Q9 of clock circuit 430 turn off.

As a result, substantially all of the current sunk by bias current source 436 flows through transistor Q7, while substantially none of the current sunk by bias current source 436 flows through transistor Q8. Similarly, substantially all of the current sunk by bias current source 438 flows through transistor Q10, while substantially none of the current sunk by bias current source 438 flows through transistor Q9.

When current flows through transistor Q7 while the voltage on the data input IN-M of master circuit 410 is high relative to the voltage on the inverse data input INZ-M, a third voltage substantially equal to the first voltage less the base-emitter voltage drop of transistor Q5A is generated on the emitter of transistor Q5A.

When current flows through transistor Q10 while the voltage on the data input IN-M of master circuit 410 is high relative to the voltage on the inverse data input INZ-M of master circuit 410, a fourth voltage substantially equal to the second base voltage less the base-emitter voltage drop of transistor Q6A is generated on the emitter of transistor Q6A. The third voltage represents a logic low, while the fourth voltage represents a logic high.

Thus, since the first voltage is lower than the second voltage by the product of the current sunk by bias current source 416A multiplied by the value of resistor R1A, the third voltage on the emitter of transistor Q5A is also lower than the fourth voltage on the emitter of transistor Q6A by the product of the current sunk by bias current source 416A multiplied by the value of resistor R1A.

As a result, the voltage on the emitter of transistor Q5A is low relative to the voltage on the emitter of transistor Q6A. When the voltage on the emitter of transistor Q5A goes low relative to the voltage on the emitter of transistor Q6A, substantially all of the current sunk by bias current source 422A flows through transistor Q3A and substantially none of the current sunk by bias current source 422A flows through transistor Q4A. As a result, the voltage on the collector of transistor Q3A is lower than the voltage on the collector of transistor Q4A. Thus, when the clock signal CLK transitions to a logic high, master circuit 410 writes a logic low to transistor Q3A and a logic high to transistor Q4A.

The voltages on the emitters of transistors Q5A and Q6A also define the magnitudes of the currents that flow through resistors R3A and R4A. The voltage on the cathode of diode D2A is equal to the power supply voltage VDD minus the voltage drop across diode D2A. The fourth voltage on the emitter of transistor Q6A is equal to the power supply voltage VDD less the base-emitter voltage drop of transistor Q6A. The base-emitter voltage drop of transistor Q6A, in turn, is substantially equal to the voltage drop across diode D2A.

As a result, there is substantially no voltage drop across resistor R4A, and substantially no current flow through resistor R4A at this time. However, since the third voltage on the emitter of transistor Q5A is less than the fourth voltage on the emitter of transistor Q6A, a voltage difference lies across resistor R3A, and a current flows through resistor R3A at this time.

When the clock signal CLK input to transistors Q7 and Q10 transitions to a logic low, and the inverse clock signal CLKZ input to transistors Q8 and Q9 transitions to a logic high, transistors Q7 and Q10 of clock circuit 430 turn off and transistors Q8 and Q9 of clock circuit 430 turn on.

As a result, substantially all of the current sunk by bias current source 436 flows through transistor Q8, while substantially none of the current sunk by bias current source 436 flows through transistor Q7. Similarly, substantially all of the current sunk by bias current source 438 flows through transistor Q9, while substantially none of the current sunk by bias current source 438 flows through transistor Q10.

Since substantially no current now flows through transistors Q4A and Q10, substantially no current flows through transistor Q6A. As a result, the voltage on the base of transistor Q6A can change without changing the voltage on the emitter of transistor Q6A, which remains equal to the fourth voltage. In addition, to change the logic states written into transistors Q3A and Q4A of master circuit 410, the voltage on the emitter of transistor Q5A must rise above the voltage on the emitter of transistor Q6A.

However, since the voltage on the emitter of transistor Q6A is a base-emitter voltage drop below the power supply voltage VDD and can not be changed at this point in response to changes in the voltage on the base of transistor Q6A, it is not possible for the voltage on the emitter of transistor Q5A to rise above the voltage on the emitter of transistor Q6A. As a result, the logic states written into transistors Q3A and Q4A are latched and can not be changed when the clock signal CLK input to transistors Q7 and Q10 transitions to a logic low, and the inverse clock signal CLKZ input to transistors Q8 and Q9 transitions to a logic high.

Slave circuit 412 operates in a similar manner. The third voltage on the emitter of transistor Q5A of master circuit 410, which represents a logic low, is presented to the inverted data input INZ-S of slave circuit 412, while the fourth voltage on the emitter of transistor Q6A of master circuit 410, which represents a logic high, is presented to the data input IN-S of slave circuit 412.

Thus, substantially all of the current sunk by bias current source 416B of slave circuit 412 flows through resistor R1B and transistor Q1B of slave circuit 412. As a result, substantially none of the current sunk by bias current source 416B of slave circuit 412 flows through transistor Q2B of slave circuit 412 at this time.

As a result, the first voltage is present on the base of transistor Q5B of slave circuit 412. In addition, since substantially no current flows through transistor Q2B, the second voltage is present on the base of transistor Q6B. As before, the first voltage represents a logic low, while the second voltage represents a logic high.

The voltages on the bases of transistors Q5B and Q6B, however, can not be passed to the emitters of transistors Q5B and Q6B when transistors Q7 and Q10 are turned on due to a lack of current. When transistor Q8 turns on in response to the clock signal CLK transitioning low, and substantially all of the current from bias current source 436 flows through transistor Q8 while the voltage on the data input IN-S of slave circuit 412 is high relative to the voltage on the inverse data input INZ-S of slave circuit 412, the fourth voltage, which is also substantially equal to the second voltage less the base-emitter voltage drop of transistor Q6B and represents a logic high, is generated on the emitter of transistor Q6B.

When transistor Q9 turns on and substantially all of the current from bias current source 438 flows through transistor Q9 while the voltage on the data input IN-S of slave circuit 412 is high relative to the voltage on the inverse data input INZ-S of slave circuit 412, the third voltage, which is also substantially equal to the first voltage less the base-emitter voltage drop of transistor Q5B and represents a logic low, is generated on the emitter of transistor Q5B.

As a result, the voltage on the emitter of transistor Q5B is low relative to the voltage on the emitter of transistor Q6B. When the voltage on the emitter of transistor Q5B goes low relative to the voltage on the emitter of transistor Q6B, substantially all of the current sunk by bias current source 422B flows through transistor Q3B and substantially none of the current sunk by bias current source 422B flows through transistor Q4B. As a result, the voltage on the collector of transistor Q3B is lower than the voltage on the collector of transistor Q4B. Thus, when the clock signal CLK transitions to a logic low, slave circuit 412 writes a logic low to transistor Q3B and a logic high to transistor Q4B.

The voltages on the emitters of transistors Q5B and Q6B also define the magnitudes of the currents that flow through resistors R3B and R4B. The voltage on the cathode of diode D2B is equal to the power supply voltage VDD minus the voltage drop across diode D2B. The fourth voltage on the emitter of transistor Q6B is equal to the power supply voltage VDD less the base-emitter voltage drop of transistor Q6B. The base-emitter voltage drop of transistor Q6B, in turn, is substantially equal to the voltage drop across diode D2B.

As a result, there is substantially no voltage drop across resistor R4B, and substantially no current flow through resistor R4B at this time. However, since the third voltage on the emitter of transistor Q5B is less than the fourth voltage on the emitter of transistor Q6B, a voltage difference lies across resistor R3B, and a current flows through resistor R3B at this time.

When the clock signal CLK input to transistors Q7 and Q10 again transitions to a logic high, and the inverse clock signal CLKZ input to transistors Q8 and Q9 again transitions to a logic low, transistors Q7 and Q10 of clock circuit 430 turn on and transistors Q8 and Q9 of clock circuit 430 turn off.

As a result, substantially all of the current sunk by bias current source 436 flows through transistor Q7, while substantially none of the current sunk by bias current source 436 flows through transistor Q8. Similarly, substantially all of the current sunk by bias current source 438 flows through transistor Q10, while substantially none of the current sunk by bias current source 438 flows through transistor Q9.

Since substantially no current now flows through transistors Q4B and Q9, substantially no current flows through transistor Q6B. As a result, the voltage on the base of transistor Q6B can change without changing the voltage on the emitter of transistor Q6B, which remains equal to the fourth voltage. In addition, to change the logic states written into transistors Q3B and Q4B of slave circuit 412, the voltage on the emitter of transistor Q5B must rise above the voltage on the emitter of transistor Q6B.

However, since the voltage on the emitter of transistor Q6B is a base-emitter voltage drop below the power supply voltage VDD and can not be changed at this time in response to changes in the voltage on the base of transistor Q6B, it is not possible for the voltage on the emitter of transistor Q5B to rise above the voltage on the emitter of transistor Q6B. As a result, the logic states written into transistors Q3B and Q4B are latched and can not be changed when the clock signal CLK input to transistors Q7 and Q10 transitions to a logic high, and the inverse clock signal CLKZ input to transistors Q8 and Q9 transitions to a logic low.

The third voltage on the emitter of transistor Q5B of slave circuit 410, which represents a logic low, is presented to the data input IN-M of master circuit 410, while the fourth voltage on the emitter of transistor Q6B of slave circuit 412, which represents a logic high, is presented to the inverted data input INZ-M of master circuit 410.

Thus, substantially all of the current sunk by bias current source 416A of master circuit 410 flows through resistor R2A and transistor Q2B of master circuit 410. As a result, substantially none of the current sunk by bias current source 416A of master circuit 410 flows through transistor Q1A of master circuit 410 at this time.

As a result, the first voltage is now present on the base of transistor Q6A of master circuit 410. In addition, since substantially no current flows through transistor Q1A, the second voltage is now present on the base of transistor Q5A. Operation then continues as described above, except that the third voltage is generated on the emitter of transistor Q6A and the fourth voltage is generated on the emitter of transistor Q5A when the clock signal CLK input to transistors Q7 and Q10 again transitions to a logic high, and the inverse clock signal CLKZ input to transistors Q8 and Q9 transitions to a logic low.

Similarly, the third voltage is generated on the emitter of transistor Q6B and the fourth voltage is generated on the emitter of transistor Q5B when the clock signal CLK input to transistors Q7 and Q10 again transitions to a logic low, and the inverse clock signal CLKZ input to transistors Q8 and Q9 transitions to a logic high.

Figure 5A:
FIGS. 5A-5D are timing diagrams illustrating the operation of frequency divider 400 in accordance with the present invention.
Figure 5B:
Figure 5C:
Figure 5D:

FIGS. 5A-5D show timing diagrams that further illustrate the operation of frequency divider 400 in accordance with the present invention. FIG. 5A shows a full-rate clock signal CLK which is input to the clock input C, while FIG. 5B shows the output OUT-M of master circuit 410, FIG. 5C shows the output OUT-S of slave circuit 412, and FIG. 5D shows the inverse output OUTZ-M of master circuit 410.

Figure 1:
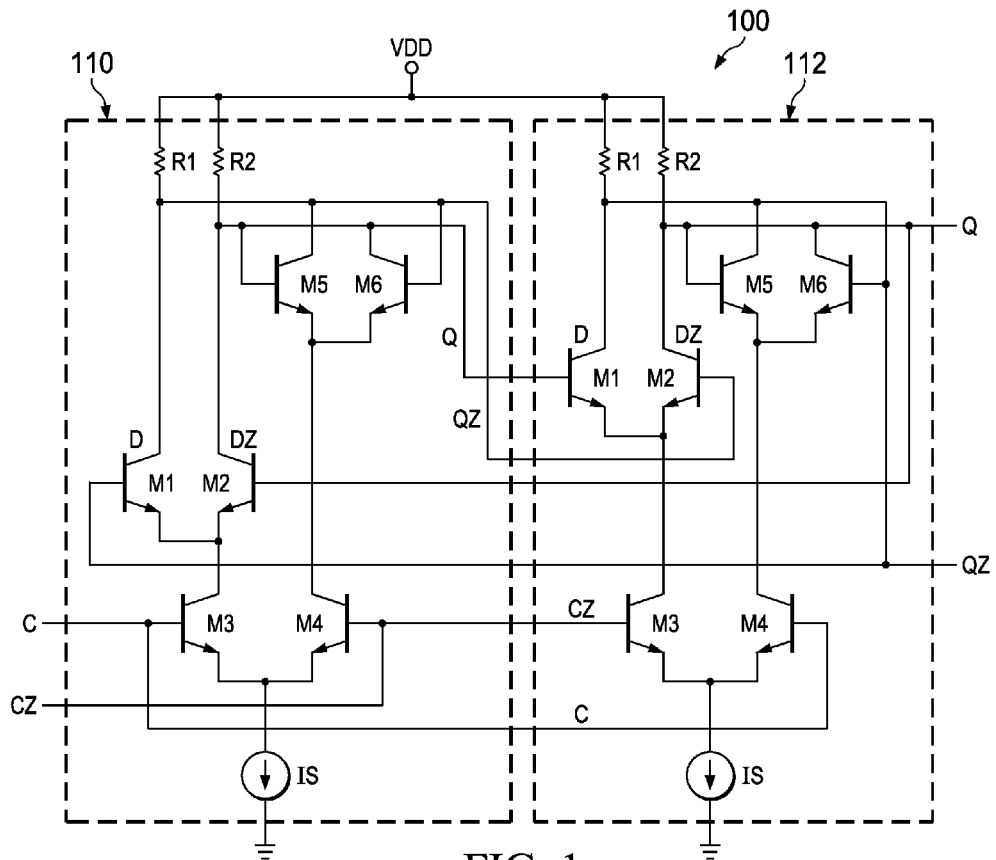
FIG. 1 is a schematic diagram illustrating an example of a conventional divide-by-two frequency divider 100.
Figure 2A:
FIGS. 2A-2C are timing diagrams illustrating the operation of frequency divider 100.
Figure 2B:

As shown in FIGS. 2B and 5B, the first half-rate clock signal generated by the output OUT-M of master circuit 410 is substantially identical to the half-rate clock signal generated by the output Q110 of master latch circuit 110, and substantially in phase with the full-rate clock signal CLK.

Figure 2C:
Figure 3:
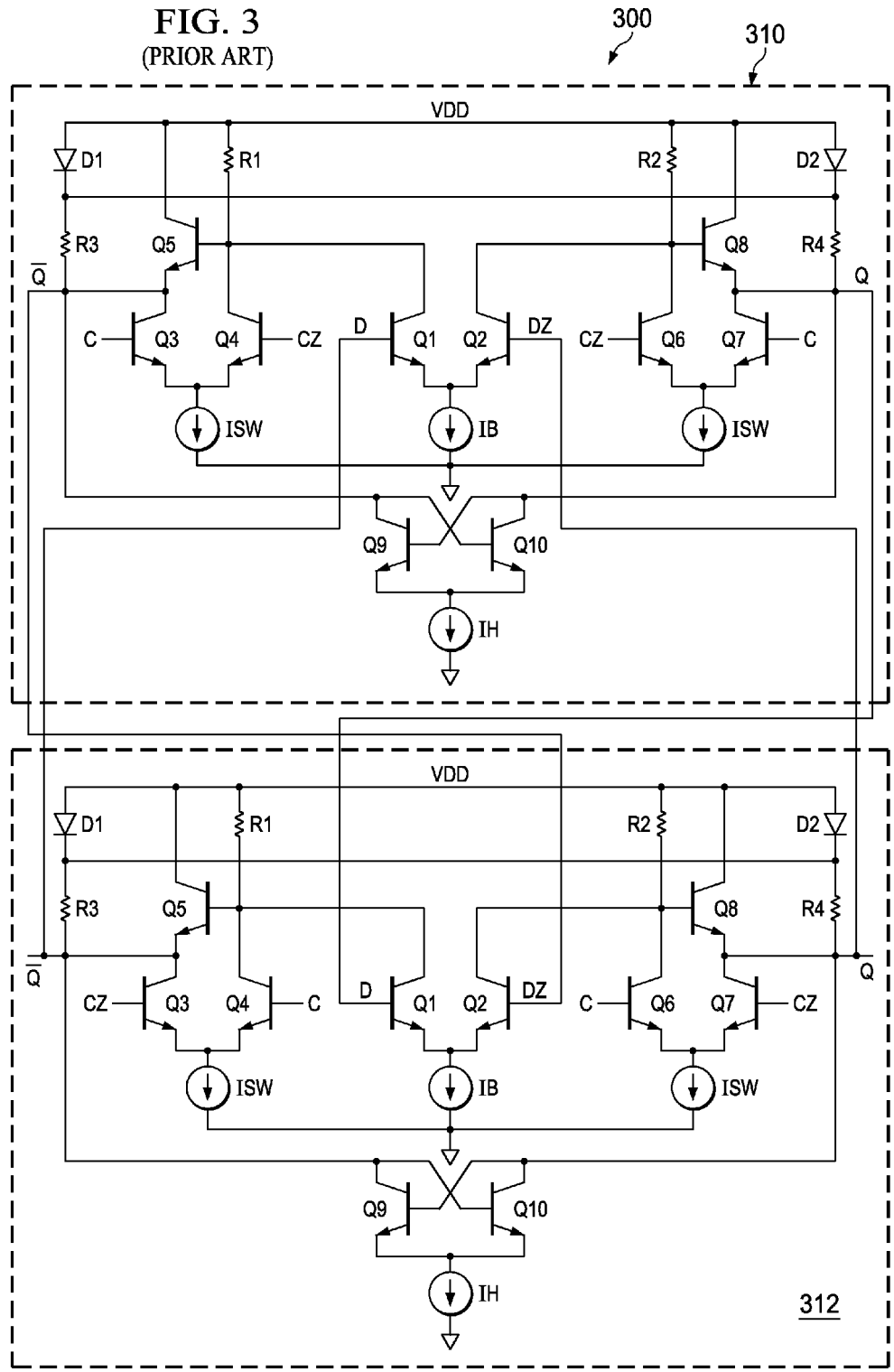
FIG. 3 is a schematic diagram illustrating an example of a conventional Kucharski divide-by-two frequency divider 300.

In addition, as shown in FIGS. 2C and 5C, the third half-rate clock signal generated by the output OUT-S of slave circuit 412 is substantially identical to the half-rate clock signal generated by the output Q112 of slave latch circuit 112. Thus, the output OUT-S of slave circuit 412 generates an in-phase clock signal I that has one-half the frequency of the full-rate clock signal CLK.

Further, as shown in FIGS. 5A-5D, the second half-rate clock signal generated by the output OUTZ-M of master circuit 410 lags the in-phase clock signal I by 90°. Thus, the inverted output OUTZ-M of master circuit 410 generates a quadrature-phase clock signal Q that has one-half the frequency of the full-rate clock signal CLK.

One of the advantages of frequency divider 400 is that frequency divider 400 consumes almost 50% less power than does the Kucharski frequency divider 300. This is because frequency divider 400 has half as many pairs of clock transistors and clock bias current sources, which sink substantially more current than the data and storage bias current sources. Another advantage of the present invention is that since half as many pairs of clock transistors are used, the present invention reduces the load on the clock path by half.

Thus, a low-voltage high-speed frequency divider in accordance with the present invention has been described that provides performance that is equal to or better than the Kucharski frequency divider 300, while at the same time consuming nearly half as much power as the Kucharski frequency divider 300.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A frequency divider comprising:
a first circuit having a data input, an inverse data input, an output that generates a first half-rate clock signal, and an inverse output that generates a second half-rate clock signal;
wherein a first pair of input transistors, having emitters, bases and collectors, wherein the base of a first transistor of the first pair of input transistors is connected to the data input and the base of a second transistor of the first pair of input transistors is connected to the inverse data input of the first circuit, and a first bias current source is connected to the emitters of the first pair of input transistors;
a first resistor pair, having a first resistor and a second resistor, the first resistor is connected between a power supply and the collector of the first transistor of the first pair of input transistors, and the second resistor is connected between the power supply and the collector of the second transistor of the first pair of input transistors;
a first pair of storage transistors, having emitters, bases and collectors, wherein the base of a first transistor of the first pair of storage transistors is connected to the collector of a second transistor of the first pair of storage transistors and also to the output of the first circuit, the base of the second transistor of the first pair of storage transistors is connected to the collector of the first transistor of the first pair of storage transistors and also to the inverse output of the first circuit, and a second bias current source is connected to the emitters of the first pair of storage transistors;
a first output transistor, having an emitter, a base and collector, wherein the collector is connected to the power supply, the base is connected to the collector of the first transistor of the first pair of input transistors and the emitter is connected to the inverse output of the first circuit;
a second output transistor, having an emitter, a base and collector, wherein the collector is connected to the power supply, the base is connected to the collector of the second transistor of the first pair of input transistors and the emitter is connected to the output of the first circuit;
a first diode connected to the power supply and a third resistor, wherein the third resistor is connected between the first diode and the inverse output of the first circuit;
a second diode connected to the power supply and a fourth resistor, wherein the fourth resistor is connected between the second diode and the output of the first circuit;
a second circuit having a data input connected to the output of the first circuit to receive the first half-rate clock signal, an inverse data input connected to the inverse output of the first circuit to receive the second half-rate clock signal, an output that generates a third half-rate clock signal, and an inverse output that generates a fourth half-rate clock signal, the output of the second circuit being connected to the inverse data input of the first circuit, the inverse output of the second circuit being connected to the data input of the first circuit;
wherein, a second pair of input transistors, having emitters, bases and collectors, wherein the base of a first transistor of the second pair of input transistors is connected to the output of the first circuit and the base of a second transistor of the second pair of input transistors is connected to the inverse output of the first circuit, and a third bias current source is connected to the emitters of the second pair of input transistors;
a second resistor pair, having a fifth resistor and a sixth resistor, the fifth resistor is connected between the power supply and the collector of the first transistor of the second pair of input transistors, and the sixth resistor is connected between the power supply and the collector of the second transistor of the second pair of input transistors;
a second pair of storage transistors, having emitters, bases and collectors, wherein the base of a first transistor of the second pair of storage transistors is connected to the collector of a second transistor of the second pair of storage transistors and also to the output of the second circuit, the base of the second transistor of the second pair of storage transistors is connected to the collector of the first transistor of the second pair of storage transistors and also to the inverse output of the second circuit, and a fourth bias current source is connected to the emitters of the second pair of storage transistors;
a third output transistor, having an emitter, a base and collector, wherein the collector is connected to the power supply, the base is connected to the collector of the first transistor of the second pair of input transistors and the emitter is connected to the inverse output of the second circuit;
a fourth output transistor, having an emitter, a base and collector, wherein the collector is connected to the power supply, the base is connected to the collector of the second transistor of the second pair of input transistors and the emitter is connected to the output of the second circuit;

a third diode connected to the power supply and a seventh resistor, wherein the seventh resistor is connected between the third diode and the inverse output of the second circuit;

a fourth diode connected to the power supply and an eighth resistor wherein the eighth resistor is connected between the fourth diode and the output of the second circuit;

a clock circuit having a clock input to receive a first full-rate clock signal, an inverse clock input to receive a second full-rate clock signal;

wherein, the clock circuit includes a first pair of clock transistors and a second pair of clock transistors, each having emitters, bases and collectors, the collector of a first transistor of the first pair of clock transistors is connected to the emitter of the first output transistor and the inverted output of the first circuit and the collector of a second transistor of the first pair of clock transistors is connected to the emitter of the fourth output transistor and the output of the second circuit, the collector of a first transistor of the second pair of clock transistors is connected to the emitter of the second output transistor and the output of the first circuit and the collector of a second transistor of the second pair of clock transistors is connected to the emitter of the third output transistor and the inverted output of the second circuit;

wherein, the clock circuit has a fifth bias current source that is connected to emitters of the first pair of clock transistors and a sixth bias current source that is connected to the emitters of the second pair of clock transistors.

2. The frequency divider of claim 1 wherein the first half-rate clock signal is substantially in phase with the first full-rate clock signal.

3. The frequency divider of claim 1 wherein the values of the first and second pairs of resistors are substantially equal.

4. The frequency divider of claim 1 is configured so that when the voltage on the base of the first transistor of the first pair of input transistors goes high relative to the voltage on base of the second transistor of the first pair of input transistors, substantially all of the current sunk by the first bias current source flows through the first resistor of the first pair of resistors and the first transistor of the first pair of input transistors, thus, substantially none of the current sunk by the first bias current source flows through the second transistor of the first pair of input transistors at this time.

5. The frequency divider of claim 1 is configured so that when the voltage on the base of the first transistor of the first pair of input transistors goes low relative to the voltage on base of the second transistor of the first pair of input transistors, substantially all of the current sunk by the first bias current source flows through the second resistor of the first pair of resistors and the second transistor of the first pair of input transistors, thus, substantially none of the current sunk by the first bias current source flows through the first transistor of the first pair of input transistors at this time.

6. The frequency divider of claim 1 is configured so that when the clock signal applied to the bases of the first transistors of the first and second pairs of clock transistors is a logic high and the inverse clock signal applied to the bases of the second transistors of the first and second pairs of clock transistors is a logic low, the first transistors of the first and second pairs of clock transistors turn on and the second transistors of the first and second pairs of clock transistors turn off resulting in that substantially all of the current sunk by the fifth bias current source flows through the first transistor of the first pair of clock transistors and all of the current sunk by the sixth bias current source flows through the first transistor of the second pair of clock transistors.

7. The frequency divider of claim 1 is configured so that when the clock signal applied to the bases of the first transistors of the first and second pairs of clock transistors is a logic low and the inverse clock signal applied to the bases of the second transistors of the first and second pairs of clock transistors is a logic high, the first transistors of the first and second pairs of clock transistors turn off and the second transistors of the first and second pairs of clock transistors turn on resulting in that substantially all of the current sunk by the fifth bias current source flows through the second transistor of the first pair of clock transistors and all of the current sunk by the sixth bias current source flows through the second transistor of the second pair of clock transistors.

* * * * *